（12）United States Patent
Bhukania et al.

(10) Patent No.: US 8,787,435 B2
(45) Date of Patent: Jul. 22, 2014

(54) NARROW BAND INTERFERENCE DETERMINED BY SECOND AND FOURTH ORDER NORMS

(71) Applicant: Texas Instruments Incorporated, Dallas, TX (US)

(72) Inventors: Bijoy Bhukania, Karnataka (IN); Jawaharlal Tangudu, Karnataka (IN); Karthik Ramasubramanian, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/047,204

(22) Filed: Oct. 7, 2013

(65) Prior Publication Data

US 2014/0036978 A1    Feb. 6, 2014

Related U.S. Application Data

(62) Division of application No. 12/698,173, filed on Feb. 2, 2010, now Pat. No. 8,582,699.

(30) Foreign Application Priority Data

Jul. 30, 2009  (IN) .......................... 1809/CHE/2009

(51) Int. Cl.
| | | |
|---|---|---|
| H04B 3/46 | (2006.01) | |
| H04B 17/00 | (2006.01) | |
| H04Q 1/20 | (2006.01) | |

(52) U.S. Cl.
USPC ......................................................... 375/224

(58) Field of Classification Search
CPC .................................................... H04B 1/1036
See application file for complete search history.

(56) References Cited

U.S. PATENT DOCUMENTS

| | | | | |
|---|---|---|---|---|
| 8,542,145 | B2 * | 9/2013 | Galati ............................. | 342/14 |
| 2004/0008616 | A1 * | 1/2004 | Jung et al. ...................... | 370/203 |
| 2004/0193411 | A1 * | 9/2004 | Hui et al. ....................... | 704/233 |
| 2005/0089087 | A1 * | 4/2005 | Sheen et al. ................... | 375/150 |
| 2006/0222116 | A1 * | 10/2006 | Hughes et al. ................. | 375/345 |

* cited by examiner

Primary Examiner — Erin File
(74) Attorney, Agent, or Firm — Lawrence J. Bassuk

(57) ABSTRACT

Automatic gain control in a receiver. A method for controlling operating range of an analog-to-digital converter (ADC) by an automatic gain control circuit includes estimating a peak-to-average ratio corresponding to an analog signal from digital samples of the analog signal. The method includes determining a peak value corresponding to the analog signal based on the peak-to-average ratio. Further, the method includes maintaining magnitude of the analog signal at an input of the ADC and gain of the receiver based on the peak value.

2 Claims, 3 Drawing Sheets

US 8,787,435 B2

NARROW BAND INTERFERENCE DETERMINED BY SECOND AND FOURTH ORDER NORMS

REFERENCE TO PRIORITY APPLICATION

This application is a Divisional of prior application Ser. No. 12/698,173, filed Feb. 2, 2010, now U.S. Pat. No. 8,582,699, issued Nov. 12, 2013;

Which claims priority from Indian Provisional Application Serial No. 1809/CHE/2009 filed Jul. 30, 2009, entitled "SIGNAL PEAK BASED AUTOMATIC GAIN CONTROLLER FOR NARROWBAND INTERFERENCE DOMINATED RECEIVERS", having same inventors and assigned to same assignee Texas Instruments Incorporated, which is incorporated herein by reference in their entirety.

TECHNICAL FIELD

Embodiments of the disclosure relate to a method and a system for gain control in a receiver.

BACKGROUND

A receiver, for example a global positioning system (GPS) receiver, includes an analog-to-digital converter (ADC) that converts an input analog signal to digital samples. Efficiency of the ADC is a function of dynamic range of operation of the ADC. The dynamic range of operation of the ADC in turn is a function of a required Signal-to-Quantum-Noise Ratio (SQNR). Often, the receiver is prone to radio frequency (RF) interference. The RF interference can be of higher magnitude than that of the input analog signal. The higher the magnitude of the RF interference, the higher must be the required SQNR of the receiver and the ADC. However, having high SQNR may not be feasible. Hence, the dynamic range of operation of the receiver and the ADC needs to be utilized optimally to relax the requirement of high SQNR.

In existing receivers, the ADC is coupled to a root-mean-square (RMS) based automatic gain control (AGC) circuit. The RMS based AGC circuit maintains a constant RMS voltage at an input of the ADC. In receivers having the RMS based AGC circuit, the dynamic range of the ADC is efficiently utilized when the input analog signal includes only desired signal. However, in presence of the RF interference, the dynamic range of the ADC may not be utilized efficiently. Further, if the magnitude of the input analog signal is greater than the desired signal, the RMS based AGC circuit may reduce the gain of the receiver to keep combined RMS amplitude of the input analog signal and the RF interference at a constant value.

SUMMARY

An example of a method for controlling operating range of an analog-to-digital converter (ADC) by an automatic gain control circuit in a receiver includes estimating a peak-to-average ratio corresponding to an analog signal from digital samples of the analog signal. Further, the method includes determining a peak value corresponding to the analog signal based on the peak-to-average ratio. Furthermore, the method includes maintaining magnitude of the analog signal at an input of the ADC and gain of the receiver based on the peak value.

An example of a method for detecting narrow band interference by an automatic gain control circuit in a receiver includes estimating a peak-to-average ratio corresponding to an analog signal from digital samples of the analog signal. The method includes comparing the peak-to-average ratio with a threshold. The method also includes detecting the narrow band interference if the peak-to-average ratio is below the threshold.

An example of a receiver includes an analog-to-digital converter (ADC) that converts an analog signal to digital samples. The receiver also includes an automatic gain control circuit coupled to the ADC. The automatic gain control circuit is responsive to the digital samples to estimate a peak-to-average ratio corresponding to the analog signal. The automatic gain control circuit also determines a peak value corresponding to the analog signal based on the peak-to-average ratio. Further, the automatic gain control circuit maintains magnitude of the analog signal at an input of the ADC and gain of the receiver based on the peak value.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

DETAILED DESCRIPTION OF THE EMBODIMENTS

Figure 1:
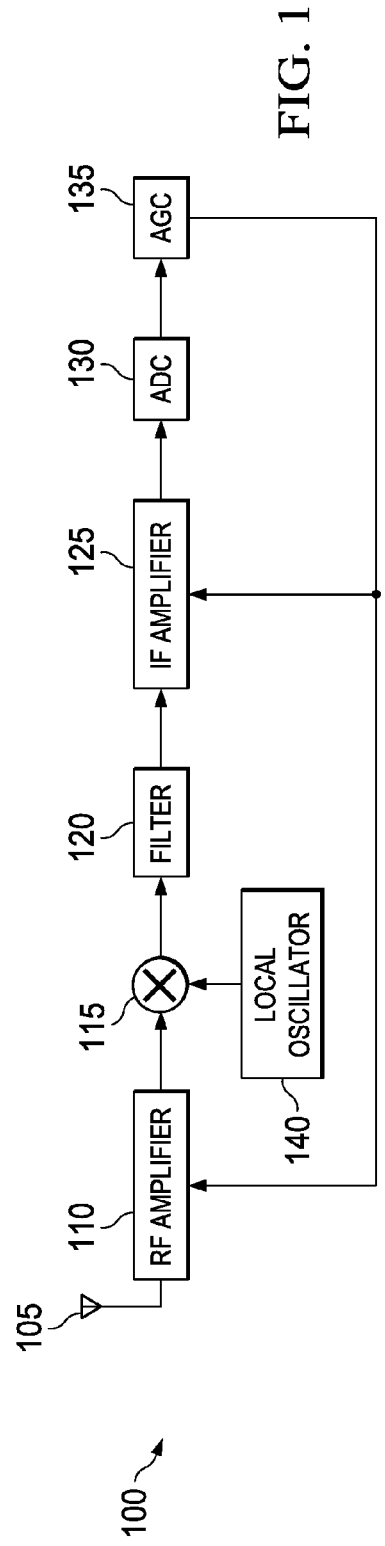
FIG. 1 is a block diagram of a receiver, in accordance with one embodiment.

FIG. 1 is a block diagram of a receiver 100. Examples of the receiver 100 include, but are not limited to a global positioning system receiver, a digital television receiver and a radio receiver. An antenna 105 receives an input analog signal, for example a radio frequency (RF) signal. An RF amplifier 110, coupled to the antenna 105, amplifies the RF signal. In one example, the RF amplifier 110 can be a low noise amplifier. The receiver 100 includes a mixer 115 to convert frequency of the RF signal to an intermediate frequency (IF) signal. The mixer 115 uses a signal from a local oscillator 140 to convert the RF signal to the IF signal. A filter 120 filters the IF signal. An IF amplifier 125 amplifies the IF signal. An analog-to-digital converter (ADC) 130 converts the IF signal to digital samples. The receiver 100 also includes an automatic gain control (AGC) circuit 135.

The AGC circuit 135 estimates a peak-to-average ratio (PAR) corresponding to the RF signal. The PAR can be estimated based on a second order norm and a fourth order norm of the digital samples. The second order norm represents root-mean-square (RMS) voltage of the digital samples. The fourth order norm is a statistical representation of peak amplitude characteristics of the digital samples. The AGC circuit 135 further determines a peak value corresponding to the RF signal based on the PAR. The AGC circuit 135 provides the peak value to the IF amplifier 125 and the RF amplifier 110 to adjust gain of the IF amplifier 125 and the RF amplifier 110, thereby maintaining the gain of the receiver 100 and magnitude of the RF signal at an input of the ADC 130. The AGC circuit 135 adjusts the magnitude of the RF signal at the input of the ADC 130 based on the peak value provided at the input of the IF amplifier 125 and the RF amplifier 110. The maintaining of the magnitude of the RF signal can also be referred to as controlling the input of the ADC 130.

In one example, an estimate of desired peak value is represented as "p" and the desired peak value at the input of the ADC 130 is represented as "s". Then the gain required by the receiver 100 can be determined as shown below, Gain=s÷p(Linear scale) Or Gain=s−p(Log scale)

In one embodiment, the AGC circuit 135 can include one or more techniques for controlling the gain of the receiver 100 based on s÷p. Various techniques can be used for controlling the gain of the receiver 100, for example a technique explained in U.S. Pat. No. 6,018,554, entitled "Automatic gain control circuit and method for full gain restart", assigned to Texas Instrument Incorporated, which is incorporated herein by reference in its entirety can be used. The peak-to-average ratio can be used as a metric to the technique described in the reference to adjust the gain and maintain the magnitude at the input of the ADC 130.

In some embodiments, the receiver 100 also detects a narrow band interference based on the PAR. The PAR of the RF signal is compared with a threshold. It is noted that the PAR of a desired signal having the narrow band interference is less than that of a desired signal without the narrow band interference. Further, if the PAR is less than the threshold, then the narrow band interference is detected. In one example, the PAR of the desired signal without the narrow band interference is as high as 14 decibels (dB), when compared to the PAR of the desired signal having the narrow band interference which can be as low as 3 dB.

Figure 2:
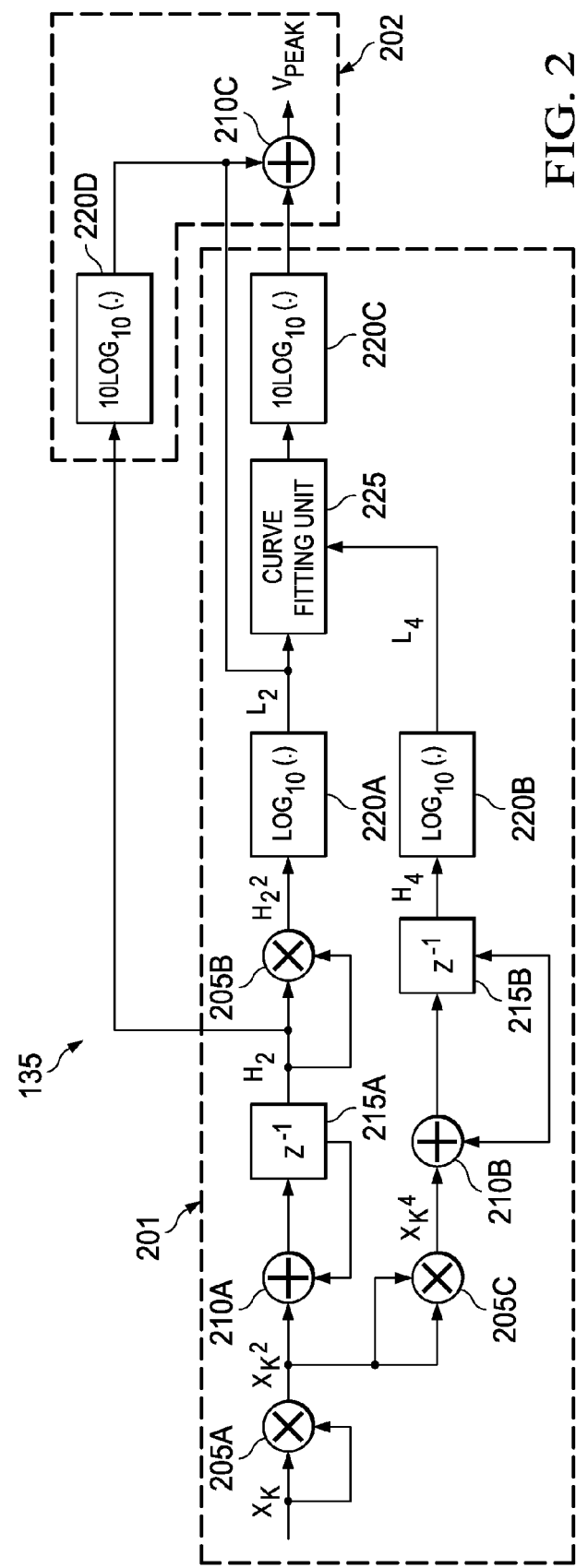
FIG. 2 illustrates a schematic diagram of control elements in an automatic gain control circuit, in accordance with one embodiment.

The AGC circuit 135 includes various control elements for controlling the input of the ADC 130 and is explained in conjunction with FIG. 2.

FIG. 2 illustrates a schematic diagram of control elements in an AGC circuit 135. The AGC circuit 135 includes an estimating unit 201 and a determining unit 202. The estimating unit 201 estimates a PAR corresponding to an analog signal. The determining unit 202 determines a peak value corresponding to the analog signal based on the PAR.

The estimating unit 201 includes a multiplier 205A coupled to a summer 210A. The summer 210A is coupled to a delay element ($z^{-1}$) 215A. The delay element 215A is coupled to a multiplier 205B. The multiplier 205B is coupled to a logarithmic element 220A.

The multiplier 205A is also coupled to a multiplier 205C. The multiplier 205C is coupled to a summer 210B. The summer 210B is coupled to a delay element ($z^{-1}$) 215B. The delay element 215B is coupled to a logarithmic element 220B.

The logarithmic element 220A and the logarithmic element 220B are coupled to a curve fitting unit 225. The curve fitting unit 225 is also coupled to a logarithmic element 220C.

The determining unit 202 includes a logarithmic element 220D and a summer 210C. The delay element 215A is coupled to the logarithmic element 220D. The logarithmic element 220D and the logarithmic element 220C are coupled to the summer 210C.

The multiplier 205A (first multiplier) is responsive to output of the ADC 130, for example a signal $X_K$, to generate a signal $X_K^2$ (first signal). The summer 210A (first summer) performs summing operation on the first signal and a delayed signal. The delayed signal can be generated by the delay element 215A (first delay element). The delay element 215A delays the signal $X_K^2$ by a predefined number of samples to generate a second order norm ($H_2$) of the signal $X_K$. The multiplier 205B (second multiplier) is responsive to $H_2$ to generate $H_2^2$. The second order norm can be determined as shown in equation (1).

$$H_2 = \frac{1}{N}\sum_{K=1}^{K=N} X_K^2 \quad (1)$$

Where N is an integer.

The multiplier 205C (third multiplier) is responsive to the signal $X_K^2$ to generate a signal $X_K^4$ (second signal). The summer 210B (second summer) performs summing operation on the second signal and a delayed signal. The delayed signal can be generated by the delay element 215B (second delay element). The delay element 215B delays the signal $X_K^4$ by the predefined number of samples to generate a fourth order norm ($H_4$) of the signal $X_K^2$. The fourth order norm can be determined as shown in equation (2).

$$H_4 = \frac{1}{N}\sum_{K=1}^{K=N} X_K^4 \quad (2)$$

The logarithmic element 220A (first logarithmic element) determines logarithm of $H_2^2$ to generate $L_2$ as shown in equation (3). The logarithmic element 220B (second logarithmic element) determines logarithm of $H_4$ to generate $L_4$ as shown in equation (4).

$$L_2 = \text{Log}_{10}(H_2^2) \quad (3)$$

$$L_4 = \text{Log}_{10}(H_4) \quad (4)$$

The curve fitting unit 225 generates a value proportional to the PAR of the RF signal based on the logarithm of the fourth order norm and square of the second order norm. The curve fitting unit 225 optimizes accuracy of the PAR based on two parameters α and β. The parameters α and β are computed using an off-line calibration procedure. Further, the curve fitting unit 225 in conjunction with the logarithmic element 220C (third logarithmic element) estimates the PAR. The PAR can be estimated as shown in equation (5).

$$PAR_{est} = 10 \log_{10}(\alpha(L_4-L_2)+\beta) \quad (5)$$

The logarithmic element 220D (fourth logarithmic element) determines the logarithm of $H_2$. The output of the logarithmic element 220D is $10 \times \text{Log}_{10}(H_2)$.

The summer 210C (third summer) is responsive to output of the logarithmic element 220C and the logarithmic element 220D to determine a peak voltage. The peak voltage can be determined as shown in equation (6).

$$V_{peak,dBv} = PAR_{est} + 10 \log_{10}(H_2) \quad (6)$$

The peak voltage is used to control magnitude of a signal at input of the ADC 130 by controlling gains of the RF amplifier 110 and the IF amplifier 125.

In one embodiment, the control elements of the AGC circuit 135 can be implemented on an integrated circuit. In some embodiments, various functions of the control elements can be implemented using software or firmware.

Figure 3:
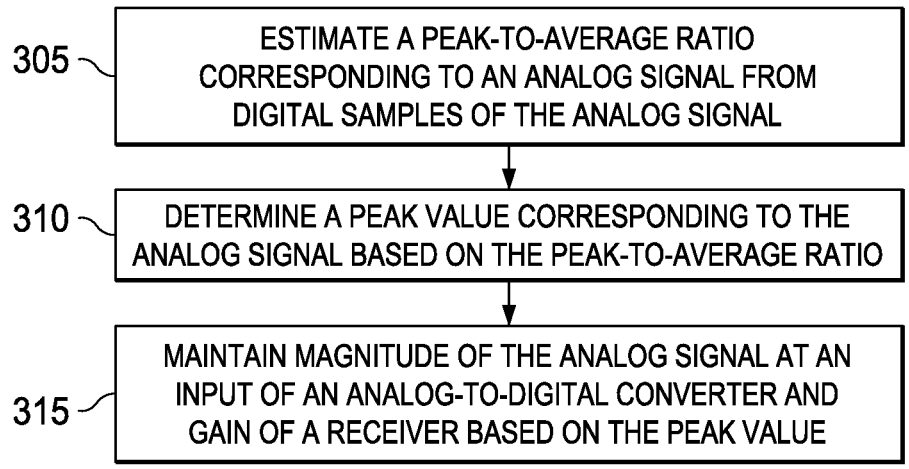
FIG. 3 illustrates a flow chart for controlling operating range of an analog-to-digital converter in a receiver, in accordance with one embodiment.

FIG. 3 is a flow chart illustrating a method for controlling operating range of an ADC, for example the ADC 130 in a receiver, for example the receiver 100. The operating range can be controlled using an AGC circuit, for example the AGC circuit 135. The ADC 130 coverts an analog signal, for example an RF signal, into digital samples. The AGC circuit 135 determines PAR of the digital samples. The PAR of the RF signal is measured for various signal parameters, for example, voltage, current, and power.

At step 305, the PAR of the RF signal is estimated from the digital samples of the RF signal. A second order norm and a fourth order norm of the digital samples are determined. The second order norm represents RMS voltage of the digital samples. The fourth order norm is the average of squared digital samples which is further squared, and is a statistical representation of peak amplitude characteristics of the digital samples. It is noted that the digital samples with higher peak amplitudes have greater effect on the fourth order norm than the digital samples with lower peak amplitudes. In one embodiment, the fourth order norm represents the PAR of the RF signal.

In one embodiment, a constant $\alpha$ and a constant $\beta$ are estimated using an off-line calibration procedure. Further, the PAR is estimated based on the constant $\alpha$ and the constant $\beta$.

At step 310, a peak value of the RF signal is determined based on the PAR.

In one embodiment, the peak value is an optimized voltage value and is provided to the ADC 130 for optimal utilization of dynamic range of the ADC 130.

At step 315, magnitude of the RF signal is maintained at an input of the ADC 130 and gain of the receiver 100 based on the peak value, by controlling gain of an RF amplifier, for example the RF amplifier 110 and gain of an IF amplifier, for example the IF amplifier 125. The maintaining of magnitude can also be referred to as controlling the input of the ADC 130.

In one embodiment, the ADC 130 receives the peak value and maintains the RF signal at the peak value, thereby optimally using the dynamic range of the ADC 130.

Figure 4:
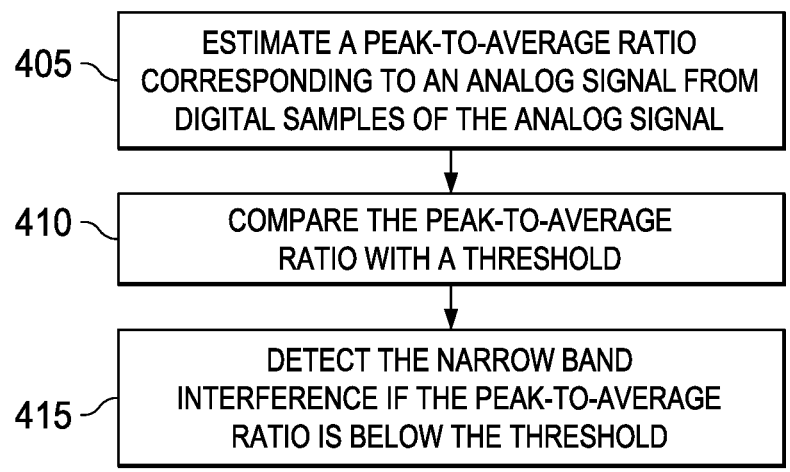
FIG. 4 illustrates a flow chart for detecting narrow band interference, in accordance with one embodiment.

FIG. 4 illustrates a flow chart for detecting narrow band interference.

Narrow band interference can be defined as an interference signal having relatively smaller bandwidth as compared to the bandwidth of a system, for example, the receiver 100. The narrow band interference can be detected using an AGC circuit, for example the AGC circuit 135.

At step 405, a PAR is estimated corresponding to an analog signal, for example an RF signal, from digital samples of the RF signal. The RF signal is received by the receiver 100 and converted to digital samples using an ADC, for example the ADC 130. The AGC circuit 135 determines PAR of the digital samples. The PAR of the RF signal is measured for various signal parameters, for example, voltage, current, and power.

At step 410, the PAR is compared with a threshold. It is noted that the PAR of a desired signal having narrow band interference is less than the PAR of a desired signal without the narrow band interference. The threshold can be predetermined based on bandwidth requirement of the receiver. In one example, the PAR of the desired signal without the narrow band interference is 14 dB. In another example, the PAR of the desired signal having the narrow band interference can be between 3 dB and 14 dB.

At step 415, the narrow band interference is detected if the PAR is below the threshold.

In one embodiment, the detected narrow band interference is used to control operating range of the ADC 130. The AGC circuit 135 detects the narrow band interference and further adjusts gain of the receiver 100 by taking into consideration effect of the narrow band interference on the operating range of the ADC 130.

Figure 5:
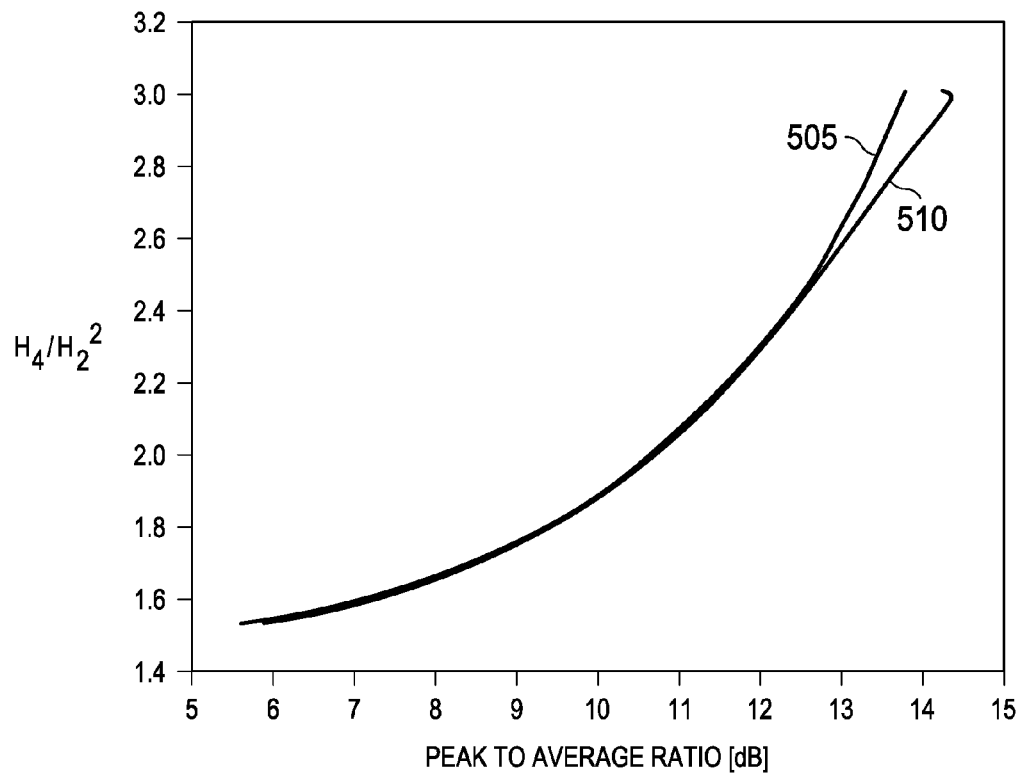
FIG. 5 is a graph illustrating simulation result of peak-to-average ratio, in accordance with one embodiment.

FIG. 5 is a graph illustrating simulation result of PAR of an RF signal. X-axis represents PAR and Y-axis represents a ratio $H_4/H_2^2$. A curve fitting unit estimates the PAR through a curve-fitting technique. Curve 505 represents a plot between actual PAR of the RF signal and the ratio $H_4/H_2^2$. Curve 510 represents a plot between the PAR of the RF signal and the ratio $H_4/H_2^2$. By analyzing the curve 505 and the curve 510, accuracy of the PAR can be determined. The closer the curves (505 and 510) are to each other, the better is the accuracy of the PAR.

Figure 6:
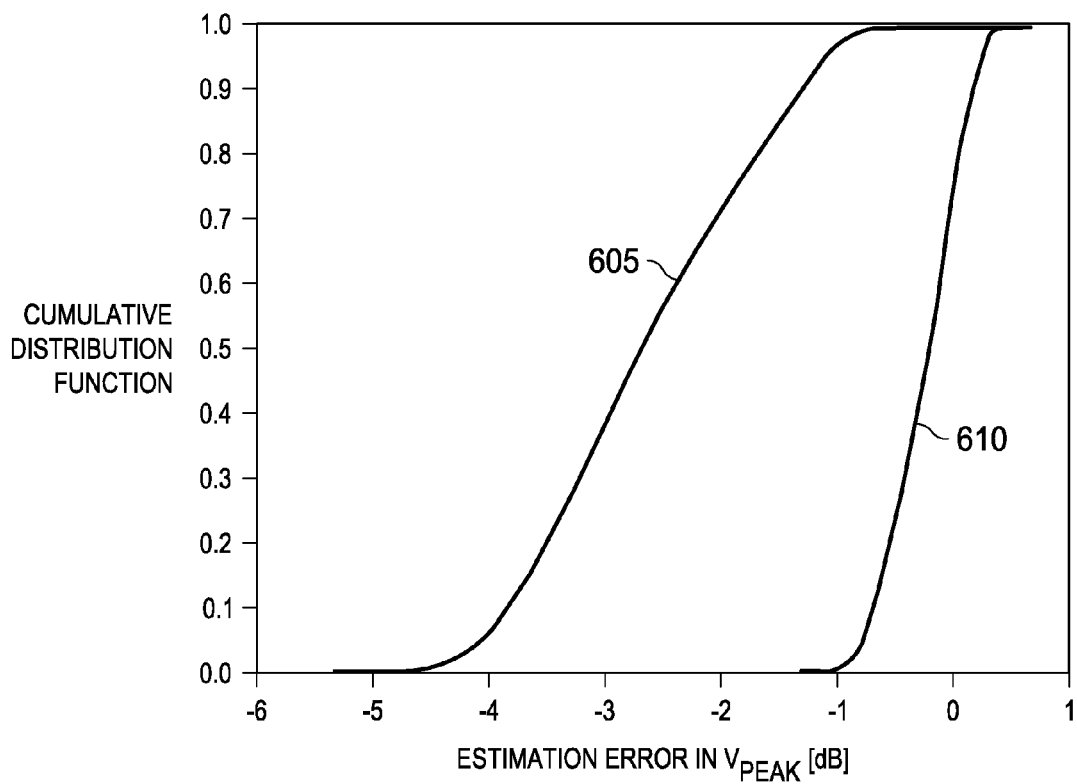
FIG. 6 is a graph illustrating simulation result of error in estimation of peak amplitude of a signal, in accordance with one embodiment.

FIG. 6 is a graph illustrating simulation result of error in estimation of peak amplitude of an RF signal. X-axis represents the error in decibels and Y-axis represents a cumulative distribution function (CDF) of the error between estimated peak amplitude and statistically determined peak amplitude of the RF signal. Referring to curve 605, maximum amplitude of the RF signal in a predefined time window is considered as an estimate of peak amplitude and the CDF is plotted for the error between estimated peak amplitude and statistically determined peak amplitude of the RF signal. Referring to curve 610, the CDF is plotted for the error between estimated peak amplitude using techniques presented in the disclosure and statistically determined peak amplitude of the RF signal. By analyzing the curve 605 and the curve 610, the error in estimation is determined. In the curve 605, the error varies between minus 5.5 dB and plus 0.5 dB and in the curve 610 the error varies between minus 1.5 dB and plus 0.5 dB. From the curves (605 and 610) it can be determined that the error in estimated peak amplitude based on the techniques described in the disclosure is lesser as compared to the error in estimating the peak amplitude based on techniques described in prior arts.

In the foregoing discussion, the term "coupled" refers to either a direct electrical connection between the devices connected or an indirect connection through intermediary devices. The term "signal" means at least one current, voltage, charge, data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description.

What is claimed is:

1. A method for detecting narrow band interference by an automatic gain control circuit in a receiver, comprising:
   A. estimating a peak-to-average ratio corresponding to an analog signal from digital samples of the analog signal, the estimating a peak-to-average ratio includes determining a second order norm of the digital samples, the second order norm representing a root-mean-square voltage of the digital samples, and determining a fourth order norm of the digital samples, the fourth order norm being a statistical representation of peak amplitude characteristics of the digital samples;
   B. comparing the peak-to-average ratio with a threshold; and C. detecting the narrow band interference if the peak-to-average ratio is below the threshold.

2. The method as claimed in claim 1 including controlling an operating range of an analog-to-digital converter based on the narrow band interference by providing the peak-to-average ratio as a metric to be used by the analog-to-digital converter.

* * * * *